United States Patent [19]
Brandle, Jr. et al.

[11] Patent Number: 5,530,267
[45] Date of Patent: Jun. 25, 1996

[54] ARTICLE COMPRISING HETEROEPITAXIAL III-V NITRIDE SEMICONDUCTOR MATERIAL ON A SUBSTRATE

[75] Inventors: Charles D. Brandle, Jr., Basking Ridge; Denis N. Buchanan, Madison; Elliot H. Hartford, Jr., New Providence; Eric S. Hellman, Montclair; Lynn F. Schneemeyer, Westfield, all of N.J.

[73] Assignee: AT&T Corp., Murray Hill, N.J.

[21] Appl. No.: 403,329

[22] Filed: Mar. 14, 1995

[51] Int. Cl.⁶ .................................. H01L 29/201
[52] U.S. Cl. ................................. 257/76; 257/505
[58] Field of Search ........................... 257/76, 507

[56] References Cited

PUBLICATIONS

"GaN, AlN, and InN: A Review", by S. Strite et al., *Journal of Vacuum Science and Technology B*, vol. 10 (4), Jul.–Aug., 1992, pp. 1237–1266.

"A Comparative Study of GaN Epilayers Grown on Sapphire and SiC Substrates by Plasma–Assisted Molecular-–Beam Epitaxy", by M. E. Lin et al., *Applied Physics Letters*, vol. 62 (26), 28 Jun. 1993, pp. 3479–3481.

"InGaN/AlGaN Double–Heterostructure Blue LEDs", by S. Nakamura, *Materials Research Society Symposium Proceedings*, vol. 339, 1994, pp. 173–178.

"Structural Classification of $RAO_3 (MO)_n$ Compounds (R=Sc, In, Y, or Lanthanides; A=Fe(III), Ga, Cr, or Al; M=Divalent Cation; N=1–11)", by N. Kimizuka et al., *Journal of Solid State Chemistry*, vol. 78, pp. 1989, pp. 98–107.

"Homologous Compounds, $InFeO_3(ZnO)_m (m=1-9)$", by N. Kimizuka et al., *Journal of Solid State Chemistry*, vol. 74, 1988, pp. 98–109.

"Structures of $LuFeO_3(ZnO)_3 (m=1,4,5and6)$", by M. Isobe et al., *Acta Crystallographica Section C*, 1994, pp. 332–336.

"Parameters for in situ Growth of High $T_c$ Superconducting Thin Films Using an Oxygen Plasma Source", by R. J. Spah et al., *Applied Physics Letters*, vol. 53, 1 Aug. 1988, pp. 441–443.

"Ion Milling and Reactive Ion Etching of III–V Nitrides", by S. J. Pearton, *Materials Research Society Symposium Proceedings*, vol. 339, 1994, pp. 179–184.

*Primary Examiner*—William D. Larkins
*Attorney, Agent, or Firm*—Eugen E. Pacher

[57] ABSTRACT

We have discovered advantageous substrates for III–V nitride semiconductors such as GaN. The substrate material is of the $YbFe_2O_4$ or $InFeO_3(ZnO)_n$ structure type and has general composition $RAO_3(MO)_n$, where R is one or more of Sc, In, Y and the lanthanides (atomic number 67–71); A is one or more of Fe(III), Ga, and Al; M is one or more of Mg, Mn, Fe(II), Co, Cu, Zn and Cd; and n is an integer$\geq 1$, typically<9. Furthermore, the substrate material is selected to have a lattice constant that provides less than ±5% lattice mismatch with the III–V nitride semiconductor material that is to be deposited thereon. At least some of the substrate materials (e.g., $ScMgAlO_4$) typically can be readily and relatively cheaply produced in single crystal form, are readily cleavable on the basal plane, and do essentially not interact chemically with the III–V nitride under typical deposition conditions. Use of the novel substrate materials for opto-electronic device manufacture is contemplated.

9 Claims, 1 Drawing Sheet

ARTICLE COMPRISING HETEROEPITAXIAL III-V NITRIDE SEMICONDUCTOR MATERIAL ON A SUBSTRATE

FIELD OF THE INVENTION

This invention pertains to wide bandgap semiconductor material such as GaN, AlN, InN, and alloys thereof. More specifically, it pertains to such material grown on a substrate, and to articles, e.g. LEDs, lasers, transistors, displays or detectors, that comprise such semiconductor material, the material being substantially epitaxial with the substrate.

BACKGROUND OF THE INVENTION

The III-V nitrides have long been viewed as a promising system for semiconductor opto-electronic device applications in the blue and ultraviolet wavelengths. See, for instance, S. Strite et al., *J. Vacuum Science and Technology B*, Vol. 10(4), p. 1237 (1992), incorporated herein by reference, for a recent review of the field.

Much research on the III-V nitrides was done since the 1960's but progress was slowed by the unavailability of suitable substrate materials. For instance, the most commonly used substrate material ($Al_2O_3$, i.e., sapphire) has approximately −13.5% lattice mismatch with GaN. Herein, lattice mismatch is defined as $(a_s-a_f)/a_f$, where $a_s$ and $a_f$ are the $a$ lattice constants of substrate and film, respectively. Unless noted otherwise, lattice mismatch values refer to mismatch at 20° C.

Many materials were investigated for use as substrates. See, for instance, section B of the above referenced article. See also Table I of the article, which lists properties of prospective nitride substrates. Yet, and despite considerable effort, ". . . the necessity of heteroepitaxial growth on a poorly matched substrate . . . " remains a challenge for today's researchers. See first paragraph of section X. of the article. See also M. E. Lin et al., *Applied Physics Letters*, Vol. 62(26), p. 3479 (1993), which asserts that "another major obstacle stifling nitride research is the lack of a suitable substrate material that is thermally and structurally compatible with the nitrides." The Strite et al. article also discloses (see p. 1262) that alternative substrate materials have recently become commercially available, and predicts that ". . . SiC, MgO, or ZnO should eventually lead to superior material as a result of their improved thermal and lattice matches to the nitrides." The Lin et al. article states (p. 3479) that the negligible lattice mismatch between (now commercially available) 6H-SiC and AlN (or GaN) ". . . makes SiC a good candidate on which to grow nitrides." It should be noted that the mismatch between the SiC and the nitride is still −3.1%.

However, SiC substrates require a surface passivation treatment. Furthermore, commercially available SiC wafers are very expensive, currently costing several thousand dollars for a 1 inch diameter wafer. In view of the potential commercial importance of high quality III-V nitride on a substrate, it would be highly desirable to have available relatively inexpensive substrate materials that support heteroepitaxial growth of high quality wurtzite III-V nitride. This application discloses such materials. Those skilled in the art know that III-V nitrides such as GaN can have wurtzite structure or zinc-blende structure. This application is concerned only with the former.

S. Nakamura (*Materials Research Society Symposium Proceedings*, Vol. 339, p. 173, (1994), incorporated herein by reference), discloses a blue light-emitting LED that comprises a InGaN/AlGaN double heterostructure on a sapphire substrate. Commercial availability of such LEDs has recently been announced.

SUMMARY OF THE INVENTION

The invention is embodied in an article that comprises a quantity of (wurtzite) III-V nitride semiconductor material on a substrate and substantially epitaxial therewith.

By "substantially epitaxial" we mean herein that the crystallographic orientation of substantially all of the (crystalline) III-V nitride material is simply related to (and determined by) the crystallographic orientation of the substrate. In a perfectly epitaxial film all of the material of the film would have crystallographic orientation that is given exactly by a unique transformation of the substrate's crystallographic orientation. This ideal is substantially never achieved in practice. Operationally, the existence or absence of "substantial epitaxy" can be readily established by, for instance, measurement of the angular width of an appropriate X-ray peak by, e.g., a "rocking curve" or a "phi scan". For purposes of this application, we define "substantial epitaxy" to exist if i) the rocking curve of the (002) peak of the nitride has full width at half maximum (FWHM) of less than 2°; or ii) the phi scan of the (102) peak of the nitride is less than 2°; and iii) the total weight of these peaks in other orientations is less than 2% of the total weight of these peaks, all as determined by conventional X-ray techniques, using $CuK_\alpha$ radiation.

Significantly, the article comprises a substrate that is essentially single crystal material of general composition $RAO_3(MO)_n$, where R is a trivalent cation, typically selected from Sc, In, Y, and the lanthanides (atomic number 57–71); A is also a trivalent cation, typically selected from Fe (III), Ga, and Al; M is a divalent cation, typically selected from Mg, Mn, Fe (II), Co, Cu, Zn and Cd; and n is an integer $\geq 1$, typically $\leq 9$, preferably $\leq 3$. We will herein refer to the $RAMO_4$ i.e., n=1) compounds as being of the "$YbFe_2O_4$" structure type, and to the $RAO_3(MO)_n$ ($n \geq 2$) compounds as being of the "$InFeO_3 (ZnO)_n$" structure type.

The essentially single crystal substrate material has (hexagonal) crystal structure of the $YbFe_2O_4$ or $InFeO_3 (ZnO)_n$ structure type and is selected to have a lattice constant $a$ that typically provides for less than ±5% (preferably less than or equal to ±2%) lattice mismatch with a desired one (e.g., GaN) of the III-V nitride semiconductor materials. A substrate material herein is "essentially single crystal" material if the material does not contain large angle (i.e., >2°) grain boundaries.

The lattice constants $a$ of AlN, GaN and InN are 0.311, 0.318 and 0.353 nm, respectively. Thus there exist alloy compositions which are perfectly lattice matched to any (hexagonal) material with lattice constant $a$ in the range 0.311 to 0.353 nm. Preferred nitride compositions for optoelectronics contain 0–70% In, corresponding to $a$ as large as about 0.343 nm. Substrates according to the invention will typically have lattice constant $a \geq 0.318$ nm, although materials with $a \leq 0.318$ nm are not excluded.

An exemplary and currently preferred substrate material is $ScAlMgO_4$, which has a lattice mismatch of less than 1.8% with GaN.

The III–V nitride semiconductor material is selected from GaN, AlN, InN, GaAlN, GaInN, AlInN and GaAlInN, with or without substitution of a minor amount (up to the solubility limit, typically <10 wt. %) of As or P for N, and with or without dopants. The notation (e.g., GaInN) is not meant to indicate the presence of equimolar amounts of, e.g., Ga, In, and N, but instead stands for, e.g., $Ga_xIn_{1-x}N$. The quantity of the nitride semiconductor material typically comprises two or more heteroepitaxial layers, either lattice matched or strained. An article that comprises the quantity of nitride semiconductor material will typically comprise contacts that facilitate flowing an electric current through the layers.

We also have preliminary indications that $LiGaO_2$ and $LiAlO_2$ can advantageously serve as substrates for wurtzite III–V nitride semiconductors. These substrates could be used in substantially the same manner as the other novel substrates disclosed herein.

BRIEF DESCRIPTION OF THE DRAWING

The figure schematically depicts an exemplary device according to the invention, namely, a LED.

DETAILED DESCRIPTION

Figure 1:
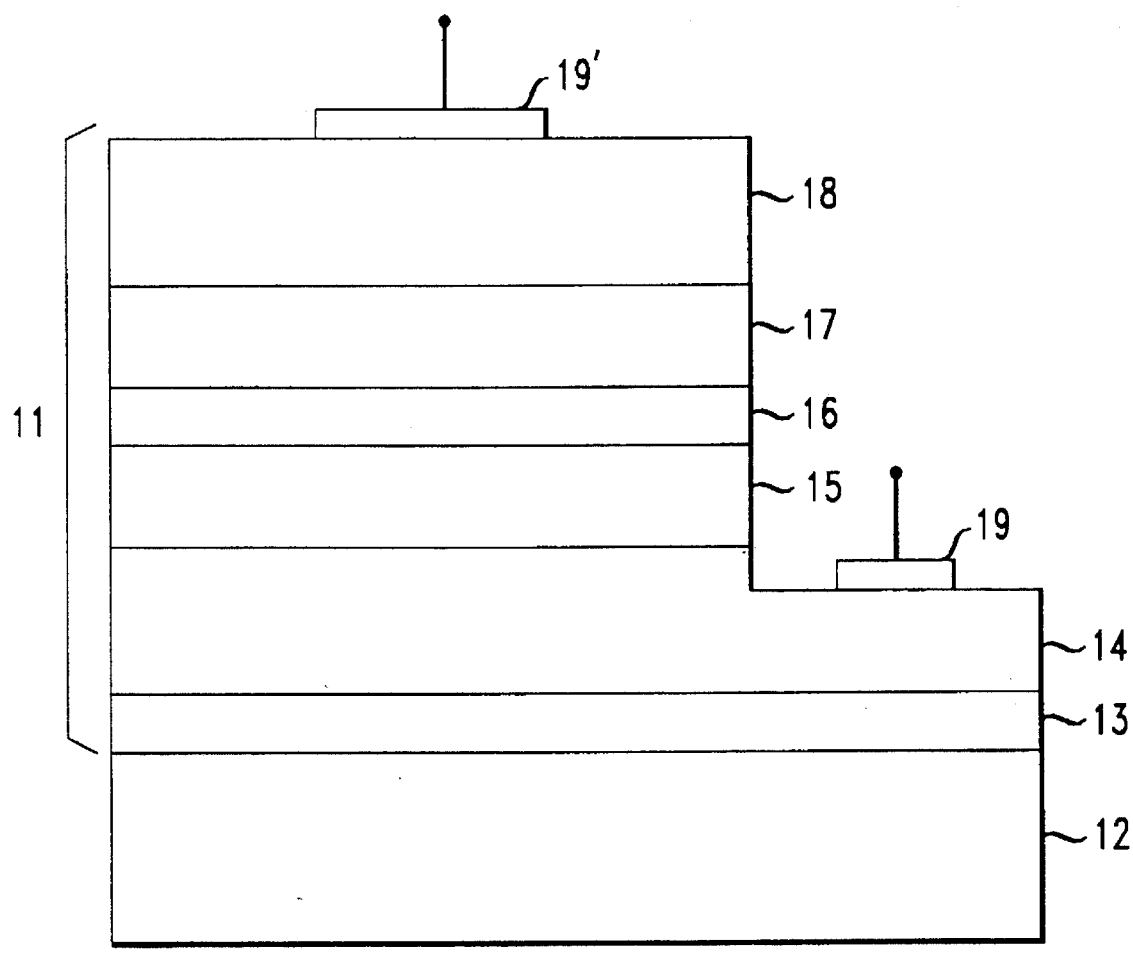

As is evident from the above background discussion, considerable effort was expended over many years to find a substrate material that can support epitaxial growth of high quality III–V nitride semiconductor material. In view of this history, our discovery of a, to the best of our knowledge not previously proposed, group of metal oxides that can advantageously be used as substrates for III–V nitride semiconductors came as a considerable surprise to us. The oxides themselves are known to solid state chemists, but their utility as substrates for III–V nitrides has, to the best of our knowledge, not previously been recognized.

As is well known to those skilled in the art, substantial lattice match is a typical requirement for epitaxial growth of one material on another. However, substantial lattice match is not the only requirement. Chemical and structural compatibility are also required. Furthermore, it is highly desirable that the appropriate crystal plane of the substrate material be a relatively low-energy plane. For instance, the (111) face of MgO has relatively good lattice match (–6.4%) with GaN. However, the (100) face of MgO has much lower surface energy than the (111) face, both in terms of cleavage and crystal growth, making the (111) face extremely difficult to prepare. Consequently, it is difficult to use MgO as a substrate for the growth of wurtzite III–V nitride semiconductors.

Thus, desirable substrate materials for III–V nitride semiconductor materials have a low energy face that has the same crystal symmetry as the nitride and has good lattice match with the nitride (exemplarily absolute value less than 5%, preferably ≤2%), and furthermore are chemically compatible with the nitride at all relevant temperatures. For practical reasons, single crystal substrate material should of course also be readily available as sizable wafers of relatively low cost.

Several oxides of general formula $RAO_3(MO)_n$ of the $YbFe_2O_4$ structure type or the $InFeO_3(ZnO)_n$ structure type can meet the above requirements. For a compilation of data on these and related metal oxides see N. Kimizuka et al., *Journal of Solid State Chemistry*, Vol. 78, p. 98 (1989), and N. Kimizuka et al., *Journal of Solid State Chemistry*, Vol. 74, p. 98 (1988), both incorporated herein by reference.

For instance, FIGS. 1a–d of the 1989 Kimizuka et al. reference disclose many such compounds of the $YbFe_2O_4$ structure type. Currently preferred compounds of the $YbFe_2O_4$ structure type are $ScGaMgO_4$, $InGaMgO_4$, $ScAlMnO_4$, $ScAlCoO_4$, $ScAlMgO_4$ and $InAlMgO_4$. A host of compounds of the $InFeO_3(ZnO)_n$ structure type are disclosed in M. Isobe, *Acta Cryst. C*, Vol. 50, p. 332 (1994), also incorporated herein by reference. Some of the compounds have n as high as 19. In principle there is no upper bound for n, although we currently believe that compounds with n>9 are not likely to be useful for purposes of this invention, due to the difficulty of making an essentially single crystal substrate with n>9 compounds. Indeed, our currently most preferred compounds have the $YbFe_2O_4$ structure type (n=1), or have the $InFeO_3(ZnO)_n$ structure type, the latter with n=2 or 3.

As can be seen from Table II of the 1989 Kimizuka et al. reference, with increasing n the lattice constant $\underline{a}$ of $InFeO_3(ZnO)_n$ decreases from 0.332 nm for n=1 to 0.327 nm for n=12, and lattice constant c increases from 2.609 nm to 8.841 nm. Appropriate selection of n thus permits some tailoring of the epitaxy-relevant lattice constant $\underline{a}$.

As is well known, the equilibrium structure of the III–V nitride semiconductors is the so-called wurtzite structure, which is of hexagonal symmetry. The $YbFe_2O_4$ structure type and $InFeO_3(ZnO)_n$ structure type are also hexagonal. Furthermore, several compounds of general formula $RAO_3(MO)_n$ that are of the above recited structure types have lattice constant $\underline{a}$ of value close to that of the lattice constant $\underline{a}$ of a III–V nitride semiconductor. For instance, $ScMgAlO_4$ and $LuFeZnO_4$ have lattice constant $\underline{a}$=0.3236 nm and 0.3411 nm, respectively, and $ScMgAlO_4$ has a mere +1.8% lattice mismatch to GaN.

Our analysis of the crystal structure of the $YbFe_2O_4$-type materials has revealed that these materials will potentially support wurtzitic growth because the oxygen sublattice of the former is nearly close-packed, as it is in wurtzite (and as it also is in sapphire, rock salt-structure oxides such as MgO, and spinel). Furthermore, the "$Fe_2O_2$" layers in $YbFe_2O_4$-type materials are quite similar in structure to the corresponding layers in wurtzite. More broadly, the compounds of general formula $RAO_3(MO)_n$ can be considered to be layered structures with alternating rock salt-like and wurtzite-like layers. From a structure point-of-view, such compounds are promising substrates for the epitaxial growth of wurtzite-type materials.

$ScMgAlO_4$ is an exemplary member of the group of compounds according to the invention, and is currently the preferred member. It can readily be grown as a single crystal boule by the known Czochralski method, as will now be illustrated.

A melt of stoichiometric composition was prepared by mixing 44.01 g MgO and 75.31 g $Sc_2O_3$, forming the mixture into a pellet, placing the pellet into a conventional iridium crucible together with 55.68 g $Al_2O_3$, and heating the charged crucible under $N_2$ in a conventional RF induction furnace. The starting materials were commercially available, and of at least 4N purity.

The charge was completely molten at about 1900° C. At this point, a thin iridium rod was dipped into the molten mass and slightly withdrawn such that a button of polycrystalline $ScAlMgO_4$ was formed on the tip of the rod. The molten mass was then contacted with the button, and the rod with solidified $ScAlMgO_4$ thereon was slowly withdrawn (initially at 2.5 mm/hr) and rotated at 15 rpm. After about 1½ hours the withdrawal rate was gradually increased to 4 mm/hr. Draw conditions were regulated in known manner to yield a boule having a neck (about 7 mm diameter, about 10 mm long) that smoothly blended into the main body (about 17 mm diameter, about 60 mm long). This was done to favor the growth of a limited number of relatively large crystals in the boule. The strategy was successful, yielding a boule that contained some large crystals (exemplary dimensions about 50 mm length, about 7 mm width).

It will be understood that, once proper seed crystals are available, it is a simple matter to grow boules that are essentially single crystal. It is expected that boules of other compounds according to the invention can be grown by a method substantially as described.

$ScAlMgO_4$ is a micaceous material and cleaves easily on the basal plane. In currently available samples the surface chips rather easily, so care is required. This however may improve with improving crystal quality, as was our experience with other micaceous materials.

From a portion of a $ScAlMgO_4$ boule grown as described above, essentially single crystal slices were separated with a razor blade. The slices were then mounted on a polishing block in conventional fashion and polished with emery paper till they were flat on a cleavage (basal) plane. The process was then repeated on the reverse side, followed by polishing of the intended growth surface with LINDE A® and LINDE B® polishing compound. After a final polish of the growth surface using SYTON® on polishing paper, the slices were soldered to heater blocks with In, and transferred into a commercially available MBE system with a previously described (R. J. Spah et al., *Applied Physics Letters*, Vol. 53, p. 441 (1988)) nitrogen plasma source.

The substrates were heated to 700° C. in vacuum, then briefly exposed to the nitrogen plasma at a temperature between 600° C. and 650° C. The nitrogen plasma typically was excited with 10–20 watts of RF power in $N_2$ at 60–80 mTorr. The RHEED (reflection high energy electron diffraction) pattern of the surface was monitored throughout the process. It was noted that the preliminary nitrogen plasma exposure resulted in substantial improvement in the RHEED pattern of the substrate. The substrate was then exposed to a Ga beam by opening the Ga furnace shutter, starting the growth of GaN. The Ga furnace temperature typically was set to obtain GaN growth rates between 80 and 500 nm/hr. The RHEED pattern remained bright at the start of GaN growth. We contrast this with our observation of reduction in pattern intensity at the start of growth of GaN on $Al_2O_3$. The RHEED patterns of the samples of GaN on $ScAlMgO_4$ typically remained sharp and bright throughout the film growth, indicative of high crystal quality of the GaN layer. After completion of growth the samples were removed from the growth chamber and further characterized by X-ray diffraction and cathodoluminescence. The former was done on a 4-axis diffractometer with $CuK_\alpha$ radiation, the latter in a scanning electron microscope (10KV).

Conventional X-ray scans were carried out on two samples to check for orientation. Both GaN films were (001) oriented, and no second orientation was seen. One of the samples was only 80 nm thick, yet its phi scan had a peak only 0.1° wider than the corresponding substrate peak of III–V nitride films. Those skilled in the art will recognize this result as extraordinary, since crystal quality of III–V nitride films generally improves with increasing film thickness, generally being quite low for films of thickness below about 0.5 μm. The rocking curve of the second GaN film (2 μm thick) indicated 0.3° FWHM.

The cathodoluminescence characterization of the above referenced GaN films showed that the defect luminescence was lower by a factor of about 5 in the films according to the invention, as compared to analogous films deposited on $Al_2O_3$. This result is clearly indicative of significantly improved crystal quality in the films according to the invention.

Although the quality of the GaN prepared as described above was remarkably high, substantially better than GaN grown under identical conditions on sapphire, we are confident that the quality can readily be further improved by, for instance, optimization of the substrate preparation procedure.

We also grew, with similar results, GaN on single crystal platelets (maximum lateral dimension about 1 cm) of $ScAlMgO_4$ that were grown by slow cooling of a stoichiometric melt. It is expected that still other growth techniques may be adapted to the growth of substrate materials according to the invention. Furthermore, those skilled in the art will appreciate that growth of the III–V nitride semiconductor on the substrate is not necessarily by MBE but can be by any appropriate growth technique, e.g., MOCVD, vapor transport, reactive sputtering or pulsed laser deposition.

After growth of an appropriate layer structure of III–V nitride semiconductor on a substrate according to this invention, the thus produced intermediate article can be processed into devices as desired. See, for instance, the above cited paper by S. Nakamura. Typically, such processing-involves patterning of the nitride layer structure, and deposition and patterning of a metal layer (or layers) such that contacts are formed for causing flow of a current through the layer structure.

FIG. 1 schematically shows an exemplary LED 10 that comprises a III–V nitride layer structure 11 on a substrate 12 according to the invention. The layer structure exemplarily consists of GaN buffer layer 13, n GaN layer 14, n AlGaN layer 15, InGaN layer 16, p AlGaN layer 17, p GaN layer 18, and contacts 19 and 19', substantially as shown in FIG. 3 of S. Nakamura (op. cit.). Patterning of the layer structure can be as described by S. J. Pearton et. al., *Materials Research Society Symposium Proceedings*, Vol. 339, p. 179 (1994). A laser according to the invention can have a similar layer structure, with reflector means (e.g., appropriately coated facets) that define the laser cavity.

The invention claimed is:

1. An article comprising a quantity of III–V nitride semiconductor material disposed on a substrate and substantially epitaxial therewith, CHARACTERIZED IN THAT
   a) said substrate is an essentially single crystal material of general composition $RAO_3(MO)_n$, where R is one or more of Sc, In, Y and the lanthanides of atomic number 67–71; A is one or more of Fe (III), Ga and Al; M is one or more of Mg, Mn, Fe (II), Co, Cu, Zn and Cd; and n is an integer $\geq 1$;
   b) said essentially single crystal substrate material has a crystal structure of the $YbFe_2O_4$ structure type or of the $InFeO_3(ZnO)_n$ structure type; and
   c) said essentially single crystal substrate material has a lattice constant that provides less than ±5% lattice mismatch with a lattice constant a of said quantity of III–V nitride semiconductor material.

2. An article according to claim 1, wherein said quantity of III–V nitride semiconductor material comprises material selected from GaN, AlN, InN, GaAlN, GaInN, AlInN, GaAlInN, and of said nitrides with As or P substituted for a portion of the nitrogen.

3. An article according to claim 1, wherein n<9.

4. An article according to claim 3, where $n \leq 3$.

5. An article according to claim 4, wherein $n = 1$.

6. An article according to claim 5, wherein said essentially single crystal substrate material is selected from $ScGaMgO_4$, $InGaMgO_4$, $ScAlMnO_4$, $ScAlCoO_4$, $ScAlMgO_4$ and $InAlMgO_4$.

7. An article according to claim 1, wherein said quantity of III–V nitride semiconductor material is a layer structure comprising at least a first and a second layer of III–V nitride semiconductor material, with the first layer differing in composition from the second layer, and with at least one of said layers comprising doped semiconductor material.

8. An article according to claim 7, further comprising contacts adapted for flowing an electric current through said layer structure.

9. An article according to claim 8, wherein said article is a semiconductor laser or a light emitting diode.

* * * * *